(12) United States Patent
Saji et al.

(10) Patent No.: US 9,894,816 B2
(45) Date of Patent: Feb. 13, 2018

(54) CIRCUIT MODULE (71) Applicant: Taiyo Yuden Co., Ltd., Tokyo (JP)

(72) Inventors: Tetsuo Saji, Tokyo (JP); Yohei Ichikawa, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 15 days.

(21) Appl. No.: 15/115,868

(22) PCT Filed: Feb. 4, 2015

(86) PCT No.: PCT/JP2015/053093
§ 371 (c)(1),
(2) Date: Aug. 1, 2016

(87) PCT Pub. No.: WO2015/119151
PCT Pub. Date: Aug. 13, 2015

(65) Prior Publication Data
US 2017/0013748 A1 Jan. 12, 2017

(30) Foreign Application Priority Data

Feb. 4, 2014 (JP) .................................. 2014-019262

(51) Int. Cl.
H05K 7/00 (2006.01)
H05K 9/00 (2006.01)
(Continued)

(52) U.S. Cl.
CPC ........... *H05K 9/0024* (2013.01); *H01L 23/00* (2013.01); *H01L 23/28* (2013.01); *H05K 1/0216* (2013.01);
(Continued)

(58) Field of Classification Search
CPC ...... H05K 1/162; H05K 1/182; H05K 1/0218; H05K 9/0032; H05K 9/0034;
(Continued)

(56) References Cited

U.S. PATENT DOCUMENTS

| 7,633,765 B1 * | 12/2009 | Scanlan | ............... | H01L 21/4857 174/262 |
| 7,745,910 B1 * | 6/2010 | Olson | ................... | H01L 21/561 257/659 |

(Continued)

FOREIGN PATENT DOCUMENTS

| JP | 2004-363347 | 12/2004 |
| JP | 2007-299099 | 11/2007 |

(Continued)

OTHER PUBLICATIONS

International Preliminary Report on Patentability dated Aug. 9, 2016 for Appln No. PCT/JP2015/053093.
(Continued)

*Primary Examiner* — Tuan T Dinh
(74) *Attorney, Agent, or Firm* — Pillsbury Winthrop Shaw Pittman, LLP (57) ABSTRACT One object is to prevent electromagnetic wave interference between electronic components with restricted increase of the size of a circuit module. A circuit module according to an embodiment includes a circuit board, a plurality of electronic components provided on the circuit board, a resin mold provided on the circuit board so as to seal the plurality of electronic components in an insulating manner, a conductive shield covering the top surface and the side surfaces of the resin mold, and a plurality of conductive poles having a columnar shape provided in the resin mold and connecting the top surface of the conductive shield and the ground of the circuit board. The resonance caused by frequencies equal to
(Continued)

or less than a predetermined maximum usable frequency is restricted.

4 Claims, 10 Drawing Sheets

(51) Int. Cl.
| | |
|---|---|
| *H01L 23/00* | (2006.01) |
| *H01L 23/28* | (2006.01) |
| *H05K 1/02* | (2006.01) |
| *H05K 1/18* | (2006.01) |

(52) U.S. Cl.
CPC ...... *H05K 1/185* (2013.01); *H01L 2924/0002* (2013.01); *H05K 2201/10371* (2013.01); *H05K 2201/10522* (2013.01)

(58) Field of Classification Search
CPC ... H05K 9/0016; H01L 23/406; H01L 23/467; H01L 23/128; H01L 23/552; H01L 23/4093; H01L 2924/3025; H01L 2924/01079; H01L 2224/16; G06F 1/182
USPC ...... 361/760–767, 816, 818; 174/50.59, 350, 174/520–524; 257/659–660, 704, 710, 257/787–790
See application file for complete search history.

(56) References Cited

U.S. PATENT DOCUMENTS

| | | | | |
|---|---|---|---|---|
| 8,592,958 | B2* | 11/2013 | Ko | H01L 21/561 |
| | | | | 257/659 |
| 8,890,309 | B1* | 11/2014 | Mugiya | H01L 23/552 |
| | | | | 257/704 |
| 2005/0230146 | A1 | 10/2005 | Koyama | |
| 2006/0258050 | A1* | 11/2006 | Fujiwara | H01L 23/29 |
| | | | | 438/112 |
| 2007/0288873 | A1 | 12/2007 | Kobayashi et al. | |
| 2012/0008288 | A1 | 1/2012 | Tsukamoto et al. | |
| 2014/0018018 | A1 | 1/2014 | Inoue | |

FOREIGN PATENT DOCUMENTS

| | | |
|---|---|---|
| JP | 2012-19091 | 1/2012 |
| JP | 2012-199463 | 10/2012 |
| WO | WO 2004/068922 | 8/2014 |

OTHER PUBLICATIONS

International Search Report dated Apr. 7, 2015 for Appln No. PCT/JP2015/053093.

* cited by examiner

CIRCUIT MODULE

CROSS REFERENCE TO RELATED APPLICATIONS

This application is the U.S. National Stage of PCT/JP2015/053093, filed Feb. 4, 2015 which in turn claims priority to Japanese Patent Application Serial No. 2014-019262, filed Feb. 4, 2014, the entire contents of all applications are hereby incorporated by reference in their entireties.

TECHNICAL FIELD

The present invention relates to a circuit module.

BACKGROUND

There has conventionally been known a circuit module including a circuit board having electronic components mounted on the surface thereof, wherein the circuit board is sealed with an insulating resin along with the electronic components, and an electromagnetic shield is formed of an electrically conductive material on the top surface and the side surfaces of the resin. It has been proposed that such a circuit module should include a conductive component for electromagnetically shielding the electronic components from each other so as to prevent electromagnetic wave interference between the electronic components in the module (see, e.g., Patent Literature 1).

RELEVANT REFERENCES

Patent Literature

Patent Literature 1: Japanese Patent Application Publication No. 2012-19091

SUMMARY

However, in such a circuit module, the conductive components should have a wall-like form to electromagnetically shield the electronic components from each other, and therefore, the conductive components tend to occupy a relatively large space. As a result, the circuit module has a large size.

One object of the embodiments of the disclosure is to prevent electromagnetic wave interference with minimum increase of the size thereof. Other objects of the embodiments of the present disclosure will be apparent with reference to the entire description in this specification.

A circuit module according to an embodiment of the present invention comprises: a circuit board having a ground; one or more electronic components provided on the circuit board; a resin mold provided on the circuit board so as to seal the one or more electronic components in an insulating manner; a conductive shield covering a top surface and side surfaces of the resin mold; and a plurality of conductive poles having a columnar shape provided in the resin mold and connecting a top surface of the conductive shield and the ground of the circuit board, all of a plurality of rectangular regions on the top surface of the conductive shield defined by side surfaces of the conductive shield and one or more of the plurality of conductive poles and including none of the plurality of conductive poles have two sides with lengths of a and b satisfying Formula (1) expressed as below, and the plurality of conductive poles are arranged such that a distance between two closest conductive poles is equal to or less than one-fourth of a wavelength at the predetermined maximum usable frequency in the resin mold. Here, the "wavelength at the predetermined maximum usable frequency in the resin mold" refers to a wavelength of an electromagnetic wave having the predetermined maximum usable frequency shortened by the wavelength reduction effect in the resin mold having a larger dielectric constant than the air.

Formula (1)

$$f_{max} < \frac{c}{2\pi\sqrt{\varepsilon_r}} \sqrt{\left(\frac{m\pi}{a}\right)^2 + \left(\frac{n\pi}{b}\right)^2} \quad (1)$$

Here, fmax is the predetermined maximum usable frequency, $\varepsilon_r$ is a relative dielectric constant of the resin mold, m and n are any integers, and c is a light speed.

In the circuit module according to an embodiment, the circuit module is a wireless communication module, and the predetermined maximum usable frequency is based on a maximum frequency in wireless communication standards supported by the wireless communication module. It may also be possible that the predetermined maximum usable frequency is equivalent to a fourth harmonic of a maximum frequency in wireless communication standards supported by the wireless communication module.

Advantages

Various embodiments of the disclosure can prevent electromagnetic wave interference between electronic components with restricted increase of the size of a circuit module.

DESCRIPTION OF EXAMPLE EMBODIMENTS

Various embodiments of the present invention will be described hereinafter with reference to the drawings.

Throughout the drawings, the same components are denoted by the same reference numerals.

Figure 1:
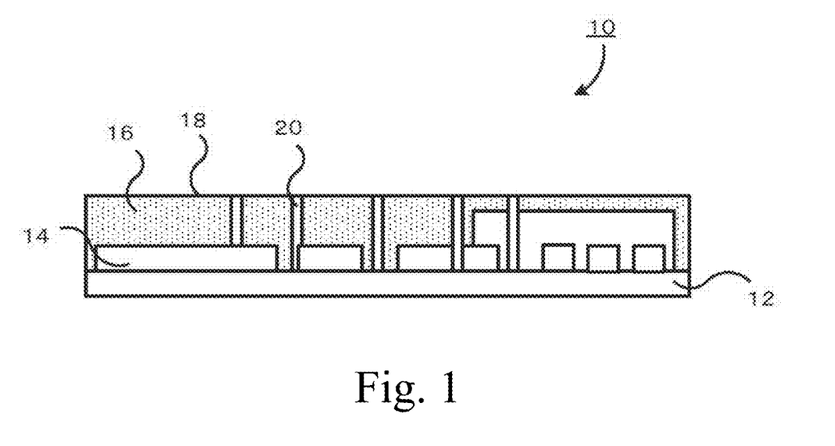
FIG. 1 is a schematic view of a section of a circuit module 10 according to an embodiment of the present invention.

FIG. 1 is a schematic view of a section of a circuit module 10 according to an embodiment of the present invention. As shown, the circuit module 10 according to an embodiment may include a circuit board 12, a plurality of electronic components 14 provided on the circuit board 12, a resin mold 16 provided on the circuit board 12 so as to seal the plurality of electronic components 14 in an insulating manner, a conductive shield 18 covering the top surface and the side surfaces of the resin mold 16, and a plurality of conductive poles 20 having a columnar shape provided in the resin mold 16 and connecting the top surface of the conductive shield 18 and the ground (not shown) of the circuit board 12.

In an embodiment, the circuit board 12 may be constituted by a ceramic board or a glass epoxy board having a substantially rectangular cuboid shape with a predetermined thickness (e.g., 0.6 mm), and the circuit board 12 may have various electronic components 14 mounted on the component-mounting surface thereof. The electronic components 14 mounted on the circuit board 12 may include an integrated circuit, a resistor, a capacitor, or other various electronic components. The ground of the circuit board 12 may be constituted by, e.g., a ground pad (not shown) provided on the component-mounting surface and a solid ground plane (not shown) provided in an inner layer and electrically connected to the ground pad.

In an embodiment, the resin mold 16 may be composed of a thermosetting resin or a UV curable resin that is insulating, waterproof, and heat resistant and may be formed by casting the resin onto the component-mounting surface of the circuit board 12 on which the electronic components 14 are surface-mounted.

In an embodiment, the conductive shield 18 may be composed of an electrically conductive material such as metals and may be formed on the top surface and the side surfaces of the resin mold 16 by conductive paste printing or by conductive paint spraying.

In an embodiment, the conductive poles may be composed of an electrically conductive material such as metals and may have a columnar shape such as a substantially cylindrical shape or a substantially rectangular column-like shape. In an embodiment, the conductive poles 20 may be formed by forming columnar holes in the resin mold 16 by laser processing or rooter processing so as to extend to the ground pad of the circuit board 12 and filling a conductive paste such as metals or a conductive paint into the columnar holes, before forming the conductive shield 18.

Figure 2:
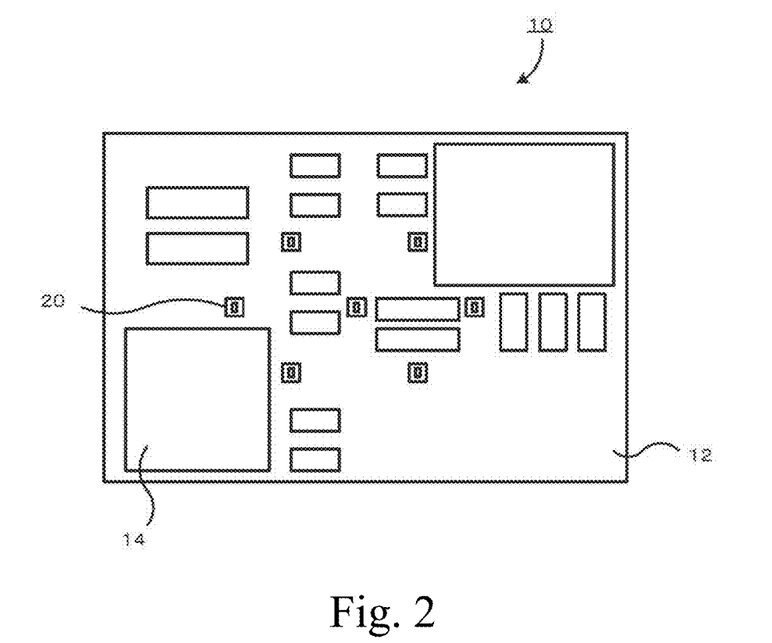
FIG. 2 is a schematic view of an example of arrangement of electronic components 14 and conductive poles 20 in the circuit module 10 according to an embodiment.

FIG. 2 is a schematic view of an example of arrangement of electronic components 14 and conductive poles 20 on the circuit board 12 according to an embodiment. In the embodiment as shown, the circuit board 12 may carry seven conductive poles 20 for example, and more specifically, the circuit board 12 may carry one conductive pole 20 in the substantial middle thereof and six conductive poles 20 around the one conductive pole 20. As shown, the plurality of conductive poles 20 may be provided in the space between the plurality of electronic components 14 mounted on the circuit board 12. The arrangement of the electronic components 14 and the conductive poles 20 in FIG. 2 is an example. As will be described later, the circuit module 10 in an embodiment may include various numbers of conductive poles 20 at various locations.

Figure 3:
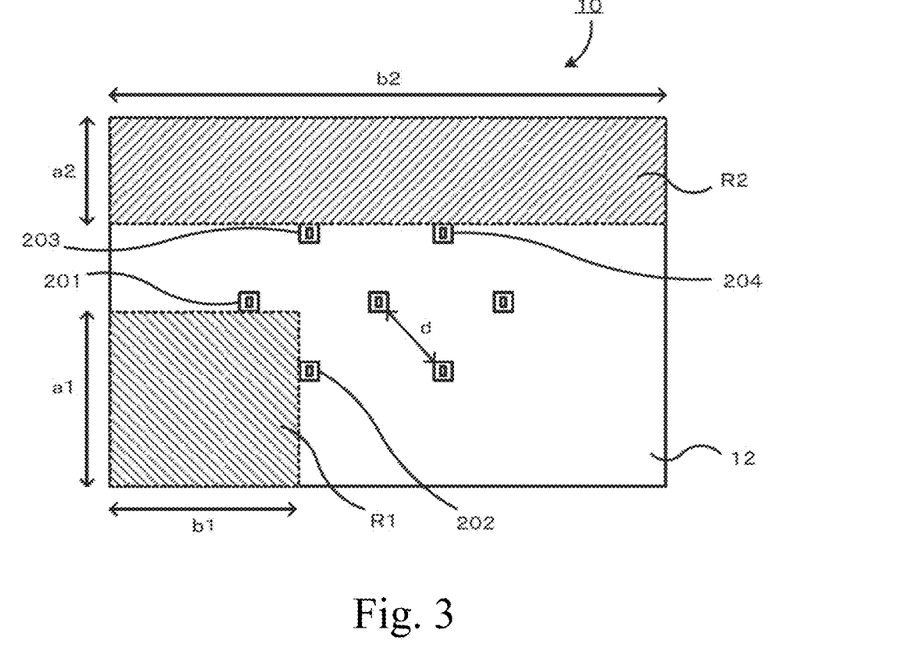
FIG. 3 illustrates a method of arranging the conductive poles 20 according to an embodiment.

FIG. 3 illustrates a method of arranging the conductive poles 20 according to an embodiment. In an embodiment, the conductive poles 20 may be arranged such that all rectangular regions on the circuit board 12 (or the top surface of the conductive shield 18) defined by the side surfaces of the conductive shield 18 (or the ends of the circuit board 12) and the conductive poles 20 and not including a conductive pole 20 may have two sides with lengths of a and b satisfying the above Formula (1). For example, the two sides of the rectangular region R1 shown in the lower left corner in FIG. 3 (the region defined by the left end and the lower end of the circuit board 12 and the conductive poles 201 and 22) may have lengths of a1 and b1 satisfying the above Formula (1), and likewise, the two sides of the rectangular region R2 shown in the top end in FIG. 3 (the region defined by the left end, right end, and top end of the circuit board 12 and conductive poles 203 and 204) may have lengths of a2 and b2 satisfying the above Formula (1).

In an embodiment, the distance between the two closest conductive poles 20 (the distance d in FIG. 3) may be equal to or less than one-fourth of the wavelength at the predetermined maximum usable frequency in the resin mold 16. In other words, the distance between the two closest conductive poles 20 may be equal to or less than one-fourth of the wavelength of an electromagnetic wave having the predetermined maximum usable frequency shortened by the wavelength reduction effect in the resin mold 16 having a larger dielectric constant than the air. The distance d may satisfy the following Formula (2).

Formula (2)

$$d \leq \frac{c}{4\sqrt{\varepsilon_r} \, f_{max}} \qquad (2)$$

Here, fmax is the predetermined maximum usable frequency, $\varepsilon_r$ is a relative dielectric constant of the resin mold, and c is a light speed.

Formula (1) above will now be described. The left side of Formula (1) may represent a maximum usable frequency expected in use of the circuit module 10, and the right side may represent a resonance frequency in the top surface of the conductive shield 18. Accordingly, in the top surface of the conductive shield 18 of the circuit module 10 having the conductive poles 20 arranged therein so as to satisfy Formula (1), the rectangular regions described above may have a resonance frequency higher than the maximum usable frequency. Additionally, in regions near the middle of the circuit board 12 (or the top surface of the conductive shield 18) (the regions surrounded by the conductive poles 20 arranged close to the side surfaces of the conductive shield 18), the distance between the two closest conductive poles 20 may also be equal to or less than one-fourth of the wavelength at the predetermined maximum usable frequency in the resin mold 16. Therefore, the resonance at a frequency equal to or less than the maximum usable frequency may be restricted in the top surface of the conductive shield 18.

For example, with the circuit board 12 (or the top surface of the conductive shield 18) having two sides with lengths of 18 mm and 25 mm, the resin mold 16 having a relative dielectric constant ($\varepsilon_r$) of 3.5, and no conductive pole 20 provided, the resonance frequency (fmn) in the top surface of the conductive shield 18 may be determined by the right side of Formula (1) as in Table 1 below.

TABLE 1

| m | n | fmn(Hz) |
|---|---|---------|
| 1 | 1 | 5.4888E+09 |
| 1 | 2 | 7.8092E+09 |
| 2 | 1 | 9.4684E+09 |

For a wireless communication module supporting the W-CDMA system, a wireless communication standard, the upstream (sending) frequency in Band 1 of the W-CDMA system is 1.95 GHz, and a power amplification circuit (PA) in a module sending a wave of 1.95 GHz may produce fourth harmonic of 7.8 GHz. If, as shown in Table 1, the resonance frequency in the top surface of the conductive shield of this module is 7.8 GHz, the top surface of the conductive shield may be resonated by the fourth harmonic from the power amplification circuit, and for example, a signal from the power amplification circuit may electromagnetically couple to a wireless IC in the module to cause degradation in characteristics of the wireless IC (e.g., degradation of oscillation signals), and the fourth harmonic may be emitted as unwanted emissions.

In the circuit module 10 according to an embodiment, if the predetermined maximum usable frequency is set at a value (e.g., 10 GHz) equal to or greater than 7.8 GHz, which is a frequency of the fourth harmonic described above, so as to satisfy Formula (1) above, and the conductive poles 20 are arranged such that the distance between the two closest conductive poles 20 is equal to or less than one-fourth of the wavelength at the maximum usable frequency (shortened by the wavelength reduction effect), the resonance of the conductive shield caused by frequencies equal to or less than that of the fourth harmonic may be restricted, and thus degradation in characteristics of an electronic component caused by resonance of the conductive shield and unwanted emissions may be restricted Since the circuit module 10 in an embodiment can include the conductive poles 20 in the space between the electronic components 14 mounted on the circuit board 12, the space on the circuit board 12 can be used more effectively as compared to the case where the electronic components are electromagnetically shielded from each other with wall-like conductive components. Therefore, it may be possible to prevent electromagnetic wave interference between electronic components with restricted increase of the size of a circuit module 10. Since the conductive poles 20 connect between the top surface of the conductive shield 18 and the ground of the circuit board 12, the function of the top surface of the conductive shield 18 as a ground can be reinforced As described above, in the circuit module 10 according to an embodiment, the conductive poles 20 may be arranged such that all rectangular regions on the circuit board 12 (or the top surface of the conductive shield 18) defined by the side surfaces of the conductive shield 18 (or the ends of the circuit board 12) and the conductive poles 20 and not including a conductive pole 20 may have two sides with lengths of a and b satisfying the above Formula (1). The right side of Formula (1) may be larger as the lengths a and b of the two sides of a rectangular region are smaller (in other words, as the distance between a conductive pole 20 positioned close to a side surface of the conductive shield 18 and the side surface of the conductive shield 18 is smaller). Therefore, if the conductive poles 20 are provided closer to the side surfaces of the conductive shield 18, the arrangement of the conductive poles 20 may satisfy Formula (1). However, as the conductive poles 20 are positioned closer to the side surfaces of the conductive shield 18, the space for the electronic components positioned near the side surfaces of the conductive shield 18 is smaller. Additionally, there is no need of having the right side (resonance frequency) of Formula (1) be excessively larger than the maximum usable frequency. Therefore, it may be preferable to arrange the conductive poles 20 so as to restrict the resonance of the conductive shield 18 and secure the space for the electronic components 14, or such that, for example, the right side of Formula (1) is about double the maximum usable frequency or smaller. Likewise, the conductive poles 20 should preferably be arranged such that a rectangular region like the rectangular region R2 in FIG. 3 having one side with a length corresponding to the length of one side of the circuit board 12 may have the other side with a length equal to or greater than half of the maximum length satisfying Formula (1). In other words, the conductive poles 20 should preferably be arranged such that, when the length of one side of the circuit board 12 is substituted for one of the lengths a and b in the right side of Formula (1), the other of the lengths a and b (that is, the distance between the side of the circuit board 12 and a conductive pole 20) may be equal to or greater than half of the maximum value satisfying Formula (1) (that is, the value causing the right side of Formula (1) to be closest to the maximum usable frequency). Additionally, it should be preferable that the conductive poles 20 are provided in consideration of the dimensions (width and depth) of the electronic components 14 to be mounted on the circuit board 12. For example, the conductive poles 20 should preferably be provided such that the electronic component 14 having the largest dimensions (width and depth) among the plurality of electronic components 14 to be mounted on the circuit board 12 can be arranged in a rectangular region (having two sides larger than the two sides of the largest electronic component 14).

EXAMPLES

It was verified whether, in a circuit module including conductive poles according to one embodiment, the resonance of a conductive shield can be restricted and the isolation characteristics between electronic components mounted on a circuit board can be improved. For the verification, a printed board 112 having two micro striplines 121 and 122 (Ports 1 and 2) formed thereon were prepared, a resin mold (with a relative dielectric constant of 3.5) was formed on the printed board 112, conductive poles were provided in the resin mold, and a conductive shield was formed to dimensions 25 mm wide, 18 mm deep, and 2 mm high so as to cover the resin mold, before measuring the isolation characteristics between the two micro striplines 121 and 122 (Ports 1 and 2).

Comparative Example 1

Figure 4:
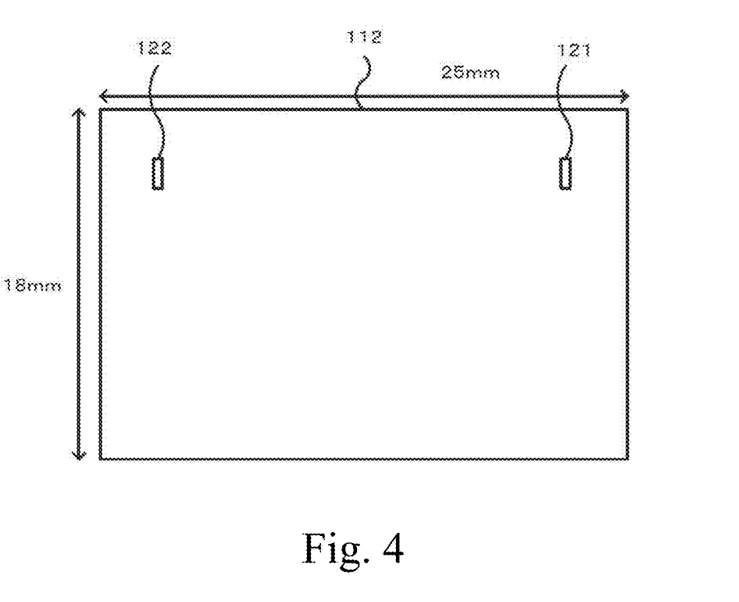
FIG. 4 is a schematic view of the top surface of the circuit board 112 in Comparative Example 1.
Figure 5:
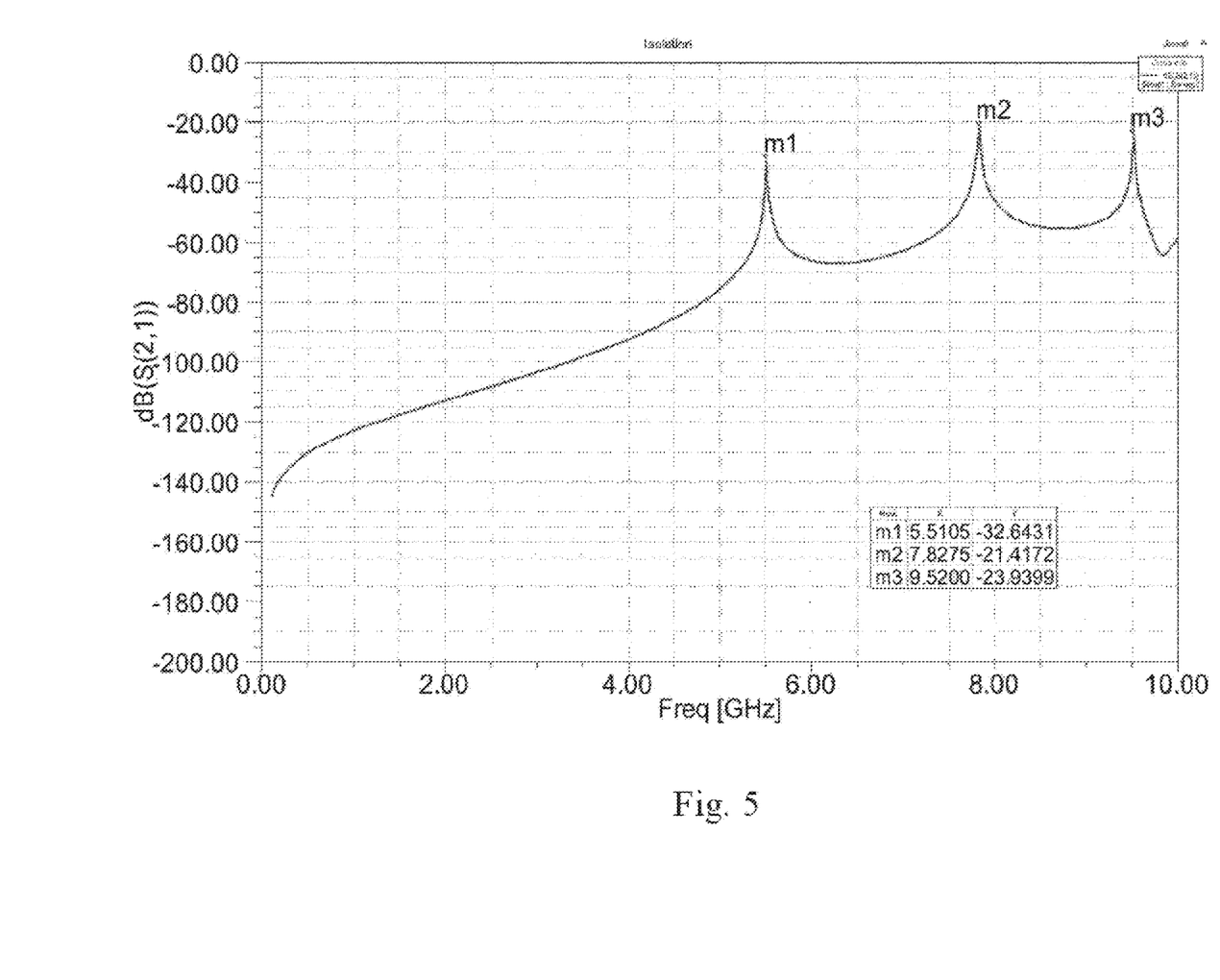
FIG. 5 illustrates the measurement result of isolation characteristics of Comparative Example 1.
Figure 6:
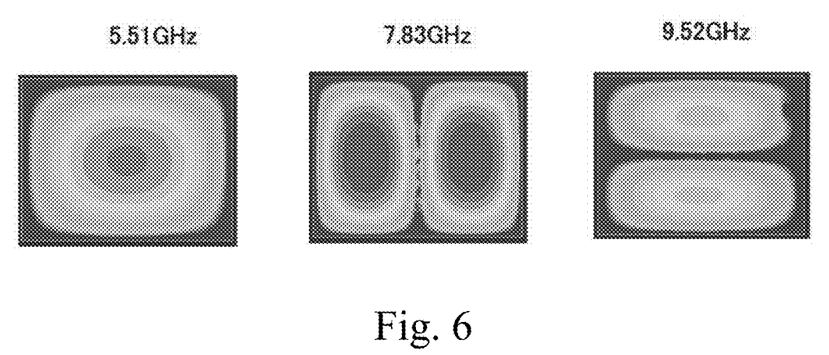
FIG. 6 illustrates the electric field distribution of Comparative Example 1.

First, a sample as Comparative Example 1 (FIG. 4) including no conductive poles was measured for the isolation characteristics between the micro striplines 121 and 122. FIG. 5 shows the measurement result. With no conductive poles provided, the resonance frequency in the top surface of the conductive shield used for the verification was the same as the resonance frequency shown in Table 1 (because the lengths of the two sides of the top surface of the conductive shield and the relative dielectric constant of the resin mold were the same as for Table 1). As shown in FIG. 5, the isolation characteristics of Comparative Example 1 were significantly degraded at the resonance frequencies shown in Table 1 (5.5 GHz, 7.8 GHz, and 9.5 GHz). FIG. 6 shows the electric field distribution in the top surface of the conductive shield at these resonance frequencies. The electric field distribution shown in FIG. 6 represents the strength of the electric field produced when (m, n)=(1, 1), (1, 2), (2, 1) for Formula 1 in the order from left to right. As shown, the "thick" of resonance can be observed for each frequency.

Comparative Example 2

Figure 7:
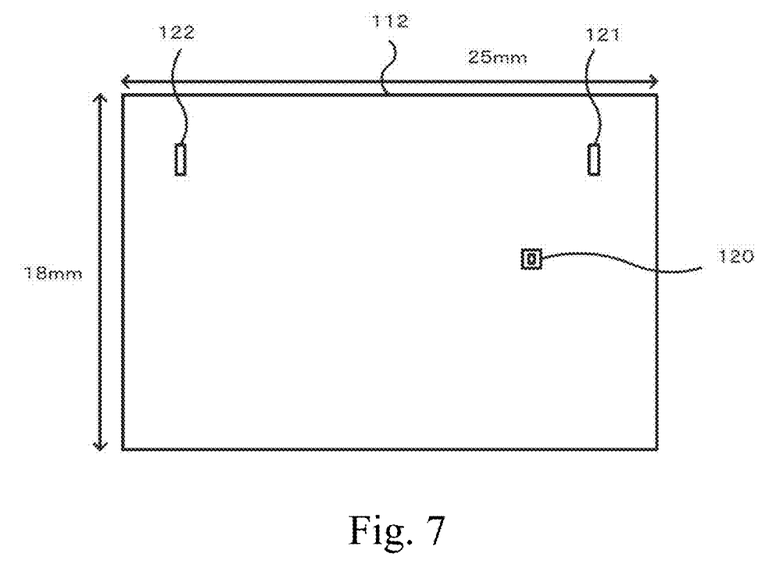
FIG. 7 is a schematic view of arrangement of a conductive pole 120 in Comparative Example 2.
Figure 8:
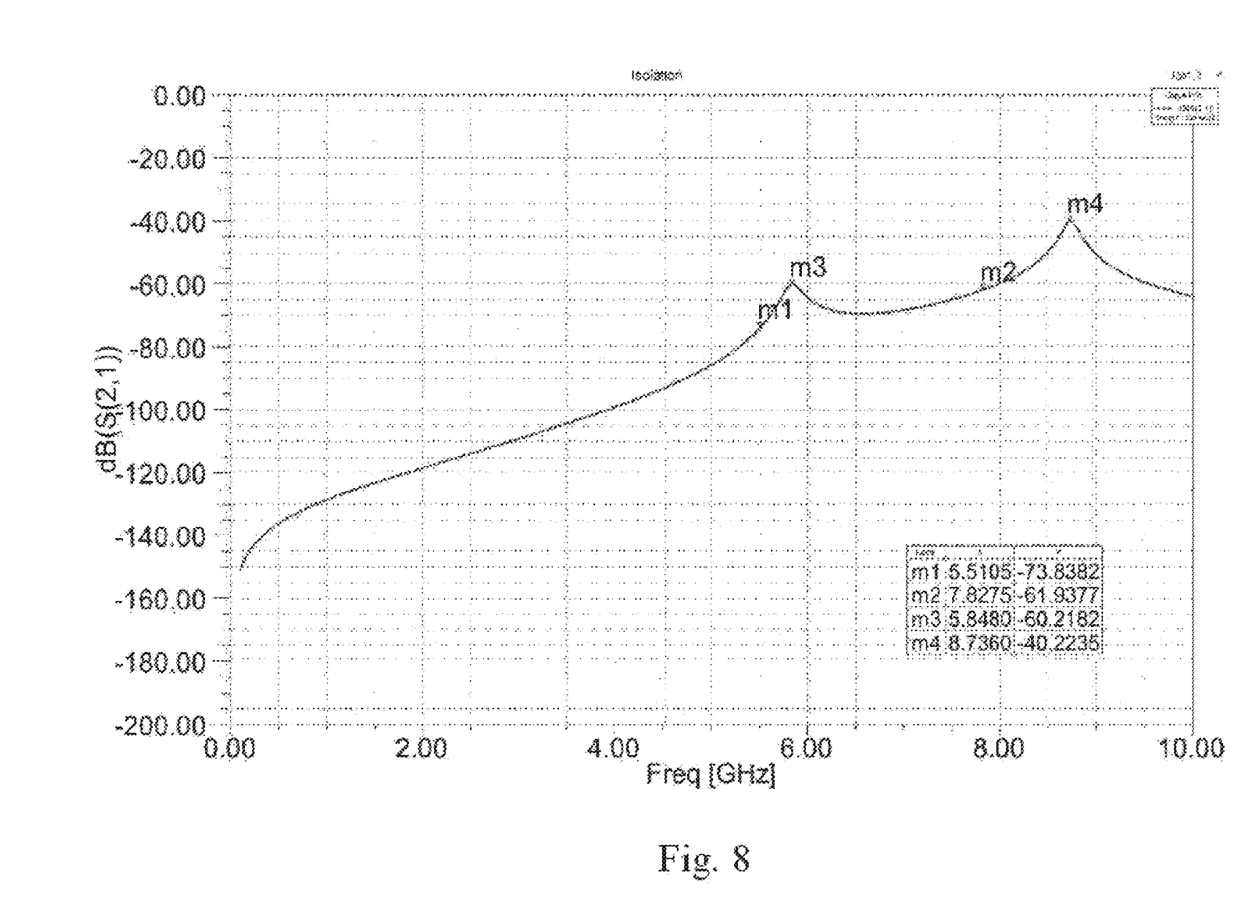
FIG. 8 illustrates the measurement result of isolation characteristics of Comparative Example 2.
Figure 9:
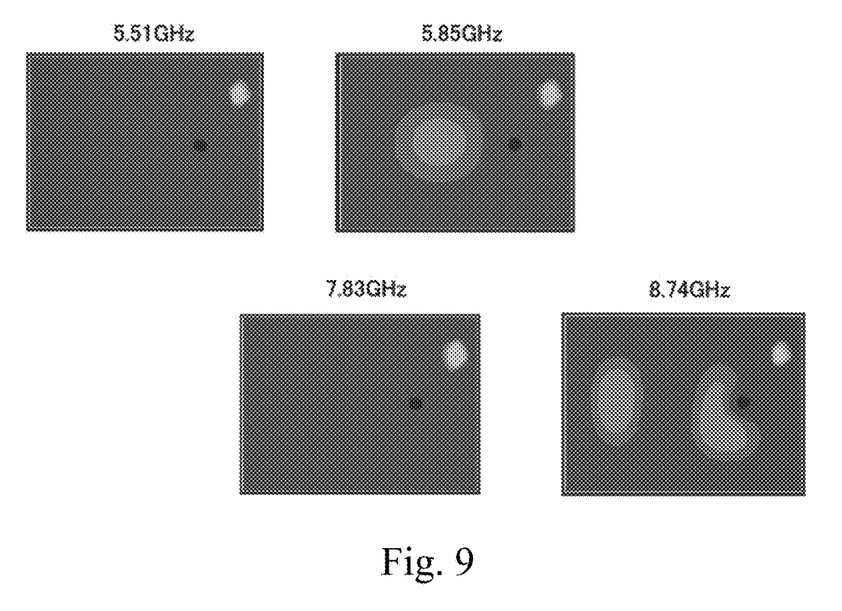
FIG. 9 illustrates the electric field distribution of Comparative Example 2.

Next, a sample as Comparative Example 2 (FIG. 7) including one conductive pole was measured for the isolation characteristics between the micro striplines 121 and 122. As shown in FIG. 7, Comparative Example 2 included one conductive pole 120 on the lower left side of the right micro stripline 121. FIG. 8 illustrates the measurement result of isolation characteristics. As shown, the frequencies at which the isolation characteristics of Comparative Example 2 were degraded were biased to higher frequency side as compared to those for Comparative Example 1. More specifically, the degradation of the isolation characteristics of Comparative Example 1 observed at 5.5 GHz (m1 in FIG. 8) was observed at 5.8 GHz for Comparative Example 2 (m3 in FIG. 8), and the degradation of the isolation characteristics of Comparative Example 1 observed at 7.8 GHz (m2 in FIG. 8) was observed at 8.7 GHz for Comparative Example 2 (m4 in FIG. 8). FIG. 9 shows the electric field distribution in the top surface of the conductive shield at the frequencies of m1 to m4 in FIG. 8. As shown, no "thick" of resonance was observed at the frequencies at which the isolation characteristics of Comparative Example 1 were degraded (5.5 GHz and 7.8 GHz), but the "thicks" of resonance were observed at the frequencies at which the isolation characteristics of Comparative Example 2 were degraded (5.8 GHz and 8.7 GHz). Accordingly, the one conductive pole 120 caused the resonance frequencies in the top surface of the conductive shield to be biased to the higher frequency side, and as a result, the frequencies at which the isolation characteristics were degraded were also biased to the higher frequency side.

Example 1

Figure 10:
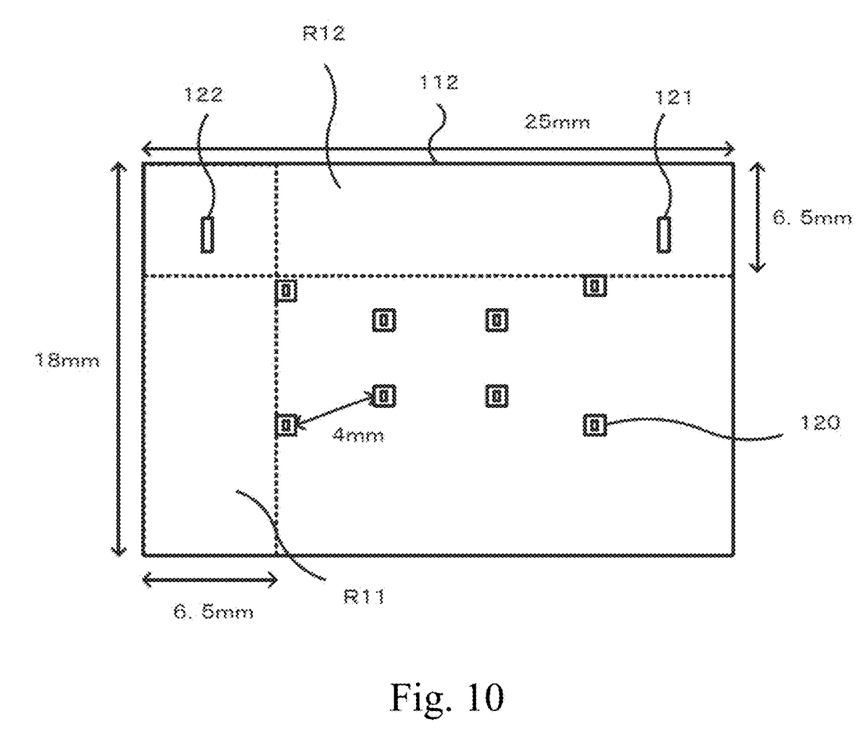
FIG. 10 is a schematic view of arrangement of conductive poles 120 in Example 1.
Figure 11:
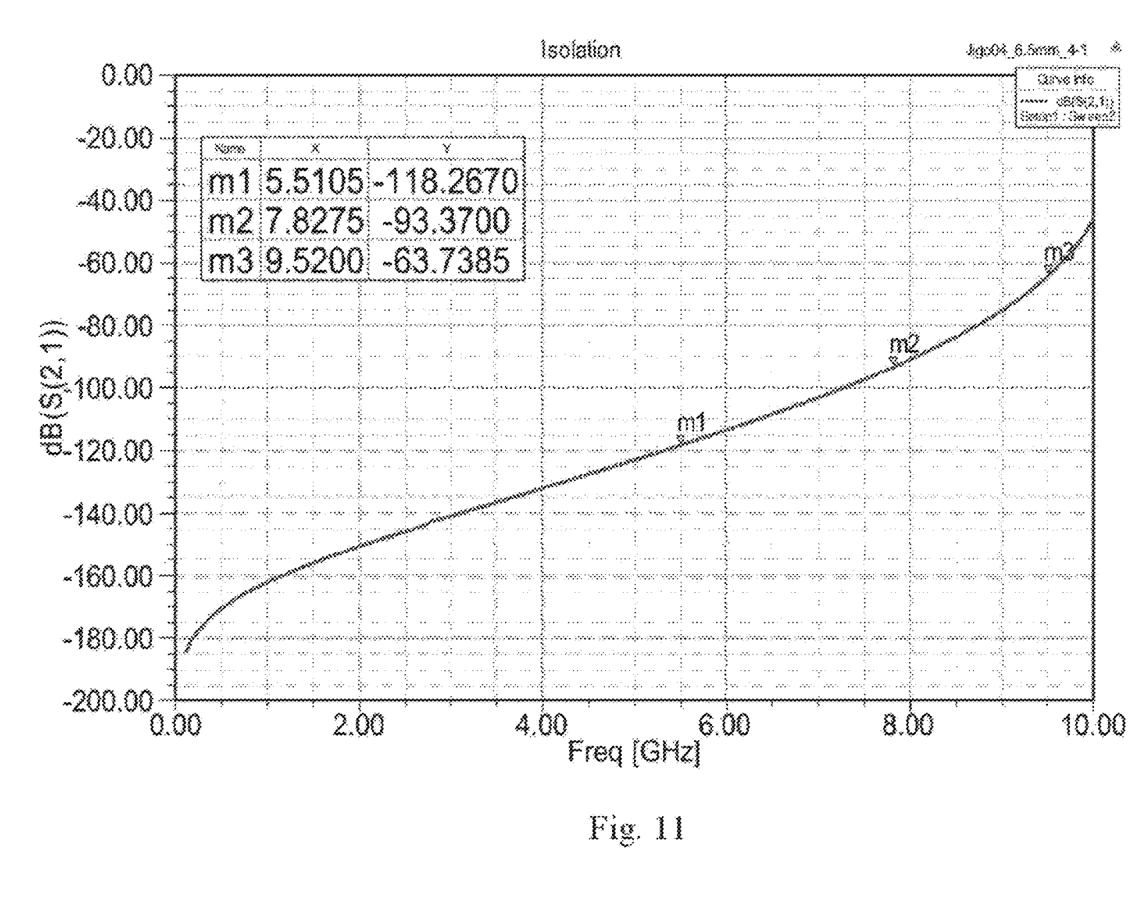
FIG. 11 illustrates the measurement result of isolation characteristics of Example 1.

Next, a sample as Example 1 (FIG. 10) including a plurality of conductive poles was measured for the isolation characteristics between the micro striplines 121 and 122. As shown in FIG. 10, Example 1 included conductive poles 120 in the four corners of the circuit board 112 such that the distances from the two side surfaces of the conductive shield (the sides of the circuit board 112) were 6.5 mm, and Example 1 further included four conductive poles 120 arranged rectangularly in the rectangular region enclosed by the four conductive poles 120 in the four corners such that the distance between the two closest conductive poles 120 was 4 mm. If the maximum usable frequency is 10 GHz in Example 1, the above-described rectangular regions (e.g., the regions R11 and R12 shown in FIG. 10) have two sides with lengths satisfying Formula (1) described above, and the distance between the two closest conductive poles 120 (4 mm) is equal to or less than one-fourth of the wavelength at the maximum usable frequency in the resin mold FIG. 11 illustrates the measurement result of isolation characteristics. As shown, there were no frequencies at which the isolation characteristics of Example 1 were degraded, and excellent isolation characteristics were observed over the entire frequency region below 10 GHz, the maximum usable frequency.

Example 2

Figure 12:
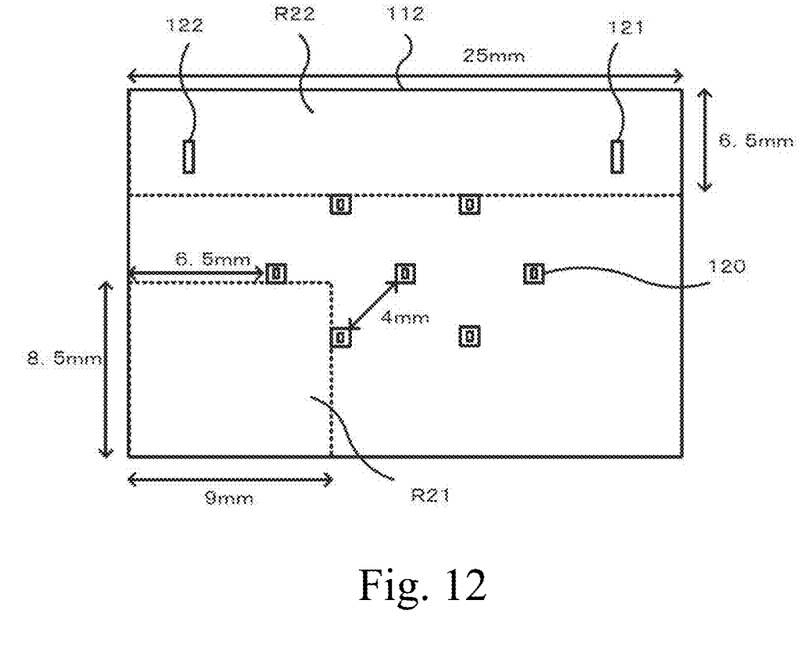
FIG. 12 is a schematic view of arrangement of conductive poles 120 in Example 2.
Figure 13:
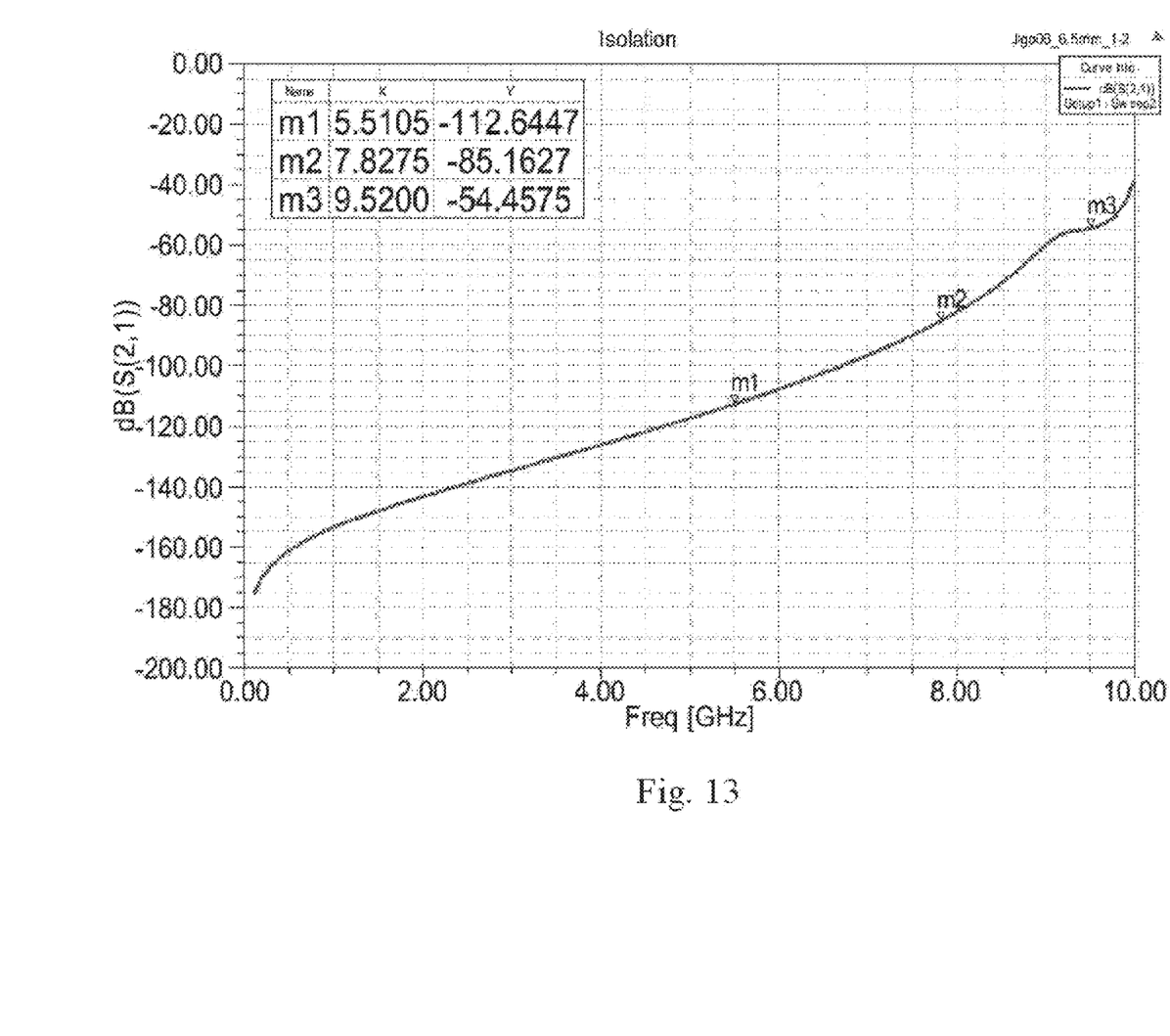
FIG. 13 illustrates the measurement result of isolation characteristics of Example 2.

Next, a sample as Example 2 (FIG. 12) including a plurality of conductive poles arranged differently than Example 1 was measured for the isolation characteristics between the micro striplines 121 and 122. As shown in FIG. 12, Example 2 was configured as follows. Two conductive poles 120 were disposed at each of the positions at a distance of 6.5 mm from the side surfaces of the conductive shield corresponding to the two long sides of the circuit board 112, the conductive poles 120 being arranged substantially in parallel to the long sides (the distances from the side surfaces of the conductive shield corresponding to the short sides of the circuit board 112 were 9 mm), one conductive pole 120 was disposed at each of the positions at a distance of 6.5 mm from the side surfaces of the conductive shield corresponding to the two short sides of the circuit board 112 (the distance from the side surfaces of the conductive shield corresponding to the long sides of the circuit board 112 were 8.5 mm), and one conductive pole 120 was disposed in the middle of the hexagonal region enclosed by the six conductive poles 120. The distance between the two closest conductive poles 120 was 4 mm. As with Example 1 described above, if the maximum usable frequency is 10 GHz in Example 2, the above-described rectangular regions (e.g., the regions R21 and R22 shown in FIG. 12) have two sides with lengths satisfying Formula (1) described above, and the distance between the two closest conductive poles 120 (4 mm) is equal to or less than one-fourth of the wavelength at the maximum usable frequency in the resin mold. FIG. 13 illustrates the measurement result of isolation characteristics. As shown and as with Example 1, there were no frequencies at which the isolation characteristics of Example 2 were degraded, and excellent isolation characteristics were observed over the entire frequency region below 10 GHz, the maximum usable frequency.

Thus, from Comparative Examples and Examples described above, it was confirmed that, in a circuit module including conductive poles according to one embodiment, the resonance frequencies were biased to the higher frequency side, which restricted the resonance of a conductive shield, and the isolation characteristics between electronic components mounted on a circuit board were improved.

LIST OF REFERENCE NUMBERS 10 circuit module
12 circuit board
14 electronic components
16 resin mold
18 conductive shield
20 conductive poles

What is claimed is:
1. A circuit module, comprising:
a circuit board having a ground;
one or more electronic components provided on the circuit board;
a resin mold provided on the circuit board so as to seal the one or more electronic components in an insulating manner;
a conductive shield covering a top surface and side surfaces of the resin mold; and
a plurality of conductive poles provided in the resin mold, the plurality of conductive poles connecting a top surface of the conductive shield and the ground of the circuit board, wherein all of a plurality of rectangular regions on the top surface of the conductive shield have two sides with lengths of a and b satisfying Formula (1) expressed as:

$$f_{max} < \frac{c}{2\pi\sqrt{\varepsilon_r}}\sqrt{\left(\frac{m\pi}{a}\right)^2 + \left(\frac{n\pi}{b}\right)^2} \quad (1)$$

where fmax is a predetermined maximum usable frequency, $\varepsilon_r$ is a relative dielectric constant of the resin mold, m and n are any integers, and c is a light speed, each of the plurality of rectangular regions being defined by side surfaces of the conductive shield and one or more of the plurality of conductive poles, each of the plurality of rectangular regions including none of the plurality of conductive poles, and wherein the plurality of conductive poles are arranged such that a distance between two closest conductive poles is equal to or less than one-fourth of a wavelength at the predetermined maximum usable frequency in the resin mold.

2. The circuit module of claim 1, wherein the circuit module is a wireless communication module, and the predetermined maximum usable frequency is based on a maximum frequency in wireless communication standards supported by the wireless communication module.

3. The circuit module of claim 1, wherein the circuit module is a wireless communication module, and the predetermined maximum usable frequency is equivalent to a fourth harmonic of a maximum frequency in wireless communication standards supported by the wireless communication module.

4. The circuit module of claim 1, wherein a rectangular region having one side with a length corresponding to a length of one side of the circuit board has the other side with a length equal to or greater than half of a maximum length satisfying Formula (1).

* * * * *